US009535277B2

(12) United States Patent
Yamazaki et al.

(10) Patent No.: US 9,535,277 B2
(45) Date of Patent: Jan. 3, 2017

(54) CONDUCTIVE OXIDE FILM, DISPLAY DEVICE, AND METHOD FOR FORMING CONDUCTIVE OXIDE FILM

(71) Applicant: Semiconductor Energy Laboratory Co., Ltd., Atsugi-shi, Kanagawa-ken (JP)

(72) Inventors: Shunpei Yamazaki, Setagaya (JP); Masashi Oota, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 348 days.

(21) Appl. No.: 14/010,849

(22) Filed: Aug. 27, 2013

(65) Prior Publication Data

US 2014/0063368 A1   Mar. 6, 2014

(30) Foreign Application Priority Data

Sep. 5, 2012  (JP) ................. 2012-195401

(51) Int. Cl.
  *G02F 1/1333*  (2006.01)
  *G06F 3/044*  (2006.01)
  *G06F 3/045*  (2006.01)

(52) U.S. Cl.
  CPC ........... *G02F 1/13338* (2013.01); *G06F 3/044* (2013.01); *G06F 3/045* (2013.01); *G06F 2203/04103* (2013.01)

(58) Field of Classification Search
  CPC ...... G02F 1/13338; G06F 3/044; G06F 3/045; G06F 2203/04103; G06F 3/0412
  See application file for complete search history.

(56) References Cited

U.S. PATENT DOCUMENTS

| 8,137,594 | B2 | 3/2012 | Imanishi et al. |
| 8,937,307 | B2 | 1/2015 | Yamazaki |
| 2003/0122794 | A1* | 7/2003 | Caldwell ........................ 345/173 |
| 2006/0270175 | A1 | 11/2006 | Aoki et al. |
| 2010/0156827 | A1* | 6/2010 | Joo et al. ....................... 345/173 |
| 2011/0149185 | A1 | 6/2011 | Yamazaki |
| 2011/0175861 | A1* | 7/2011 | Wakimoto et al. ........... 345/204 |
| 2011/0267297 | A1* | 11/2011 | Yamazaki et al. ............ 345/173 |
| 2012/0050215 | A1* | 3/2012 | Kim et al. ..................... 345/174 |
| 2012/0241735 | A1 | 9/2012 | Honda et al. |
| 2013/0161178 | A1* | 6/2013 | Kim et al. ..................... 200/600 |
| 2013/0257798 | A1 | 10/2013 | Tamura et al. |
| 2013/0321333 | A1 | 12/2013 | Tamura |
| 2014/0014948 | A1 | 1/2014 | Matsukura |

(Continued)

FOREIGN PATENT DOCUMENTS

| JP | 2009-057605 A | 3/2009 |
| JP | 2011106002 A * | 6/2011 |

*Primary Examiner* — Jessica M Merlin
(74) *Attorney, Agent, or Firm* — Robinson Intellectual Property Law Office; Eric J. Robinson

(57) ABSTRACT

One embodiment of the present invention provides a conductive oxide film having high conductivity and high transmittance of visible light. The conductive oxide film having high conductivity and high transmittance of visible light can be obtained by forming a conductive oxide film at a high substrate temperature in the film formation and subjecting the conductive oxide film to nitrogen annealing treatment. The conductive oxide film has a crystal structure in which c-axes are aligned in a direction perpendicular to a surface of the film.

10 Claims, 11 Drawing Sheets

(56) References Cited

U.S. PATENT DOCUMENTS

2014/0034954 A1 2/2014 Yamazaki et al.
2014/0042432 A1 2/2014 Yamazaki
2014/0043546 A1 2/2014 Yamazaki et al.
2014/0061636 A1 3/2014 Miyake et al.
2014/0061654 A1 3/2014 Yamazaki et al.

* cited by examiner

CONDUCTIVE OXIDE FILM, DISPLAY DEVICE, AND METHOD FOR FORMING CONDUCTIVE OXIDE FILM

BACKGROUND OF THE INVENTION

1. Field of the Invention

The present invention relates to a conductive oxide film, a display device, and a method for forming a conductive oxide film.

The present invention relates to a conductive oxide film having a crystal structure in which c-axes are aligned in a direction perpendicular to a surface of the film, and a method for forming the conductive oxide film. In addition, the present invention relates to a display device using such a conductive oxide film.

2. Description of the Related Art

Recently, touch panels having a multi-touch function have widespread rapidly in accordance with the increasing demand for smartphones or tablet PCs. Transparent conductive oxide films are utilized in touch panels, thin-film solar cells, and particle moving type electronic paper using electronic liquid powder. The demand for high-quality transparent conductive oxide films is expected to increase, and the market of the films will expand in the future.

Materials that are used for the transparent conductive oxide films are roughly classified into crystalline materials and amorphous materials. Examples of the crystalline materials are indium tin oxide (ITO) and zinc oxide (ZnO), and an example of the amorphous materials is indium zinc oxide.

ITO is the most general material of the transparent conductive oxide film, and a sputtering method is the most general method for forming the transparent conductive oxide film. For the transparent conductive oxide films, a reduction in cost of the film formation and the material as well as several properties such as high transmittance of visible light, high conductivity, and low electric resistance is required.

As a factor for indicating the conductivity of the transparent conductive oxide films, sheet resistance is used. For the uses of electronic paper, a sheet resistance of approximately 300Ω/□ to 400Ω/□ is enough for operation; however, a sheet resistance of 200Ω/□ or lower is desired for the uses of touch panels.

The sheet resistance depends on carrier density and mobility. As the sheet resistance becomes lower, the carrier density becomes higher or the mobility becomes higher, which means higher conductivity. Further, the sheet resistance depends on thickness. For example, the sheet resistance of an ITO film with a thickness of 30 nm is approximately 100Ω/□, and that with a thickness of 200 nm is approximately 10Ω/□.

In Patent Document 1, a method for forming a dense ZnO film having crystallinity is disclosed.

REFERENCE

Patent Document

[Patent Document 1] Japanese Published Patent Application No. 2009-57605

SUMMARY OF THE INVENTION

Transparent conductive oxide films are required to have high conductivity and high transmittance of visible light.

In order to have high transmittance of visible light, the transparent conductive oxide films need to have a band gap that does not exist in a visible light range of from 380 nm to 780 nm (3.26 eV to 1.59 eV). If the transparent conductive oxide films have a band gap of about 3 eV, absorption of light in the visible light range can be reduced in the films.

In order to have high conductivity, the transparent conductive oxide films need to have a carrier density that is lower than the carrier density of metal ($2.0 \times 10^{21}$ cm$^{-3}$ or more) and is high enough (approximately $1.0 \times 10^{20}$ cm$^{-3}$ to $1.0 \times 10^{21}$ cm$^{-3}$). If the transparent conductive oxide film has a carrier density higher than or equal to the carrier density of metal, reflection of light in the visible light range is increased, so that the light transmittance is decreased.

In other words, the tradeoff for either one of high conductivity and high transmittance of visible light in the transparent conductive oxide film causes an adverse effect. Higher conductivity causes lower light transmittance. In addition, higher light transmittance enhances an insulating property.

It is an object to provide a conductive oxide film having high conductivity and high transmittance of visible light.

To improve both the light transmittance and the conductivity of a conductive oxide film, the conductive oxide film is formed to have a crystal structure in which c-axes are aligned in a direction perpendicular to a surface of the film and then subjected to nitrogen annealing treatment.

One embodiment of the present invention disclosed in this specification is a conductive oxide film having a crystal structure in which c-axes are aligned in a direction perpendicular to a surface of the film. The c-axes of crystal parts included in the conductive oxide film are aligned in a direction perpendicular to the surface of the film. Note that in this specification, the "conductive oxide film having a crystal structure in which c-axes are aligned in a direction perpendicular to a surface of the film" may be referred to as a "CAAC (c-axis aligned crystalline)-conductive oxide film."

One embodiment of the present invention disclosed in this specification is a conductive oxide film having a crystal structure having a diffraction peak obtained by X-ray diffraction measurement at 31°.

Note that the fact that the diffraction peak obtained by X-ray diffraction measurement is in the vicinity of 31° can be interpreted to mean that the c-axes of crystal parts are aligned in a direction perpendicular to the surface of the film.

The above-described conductive oxide film having a crystal structure in which c-axes are aligned in a direction perpendicular to a surface of the film has a band gap of preferably larger than or equal to 2.5 eV, further preferably larger than or equal to 3.0 eV.

The conductive oxide film having a crystal structure in which c-axes are aligned in a direction perpendicular to a surface of the film has excellent light transmittance.

Although the mechanism of the excellent light transmittance of the conductive oxide film having a crystal structure in which c-axes are aligned in a direction perpendicular to a surface of the film is unclear, a possible reason of the excellent light transmittance is a relatively low density of defect states in the band gap of the CAAC-conductive oxide film compared with an amorphous conductive oxide film. The low density of defect states in the band gap leads to the suppression of absorption of light in the visible light range due to defect states. Accordingly, transmittance of visible light can be increased.

Further, another possible reason is that the conductive oxide film having a crystal structure in which c-axes are aligned in a direction perpendicular to a surface of the film tends to have a larger band gap than conductive oxide films having the other crystal structures, an amorphous conductive oxide film, and the like. Since a larger band gap enables transmission of light in a wider range of wavelength, the conductive oxide film can transmit much light in the visible light range of 380 nm to 780 nm. Accordingly, transmittance of visible light can be increased.

The above-described conductive oxide film having a crystal structure in which c-axes are aligned in a direction perpendicular to a surface of the film preferably has a sheet resistance of lower than or equal to 40Ω/□.

The above-described conductive oxide film having a crystal structure in which c-axes are aligned in a direction perpendicular to a surface of the film particularly preferably has a sheet resistance of lower than or equal to 40Ω/□ when having a thickness of more than or equal to 1 nm and less than or equal to 100 nm.

The conductive oxide film having a crystal structure in which c-axes are aligned in a direction perpendicular to a surface of the film has excellent conductivity.

Although the mechanism of the excellent conductivity of the conductive oxide film having a crystal structure in which c-axes are aligned in a direction perpendicular to a surface of the film is unclear, a possible reason of the excellent conductivity is high mobility of the conductive oxide film. Since the conductive oxide film having a crystal structure in which c-axes are aligned in a direction perpendicular to a surface of the film can have a relatively low density of defect states in the band gap, the number of impurity scattering factors that cause a reduction of mobility can be small.

In the case of providing a function of sensing a touch position (touch panel) outside a display device such as a liquid crystal display device or an organic EL display device or an electronic device, the conductive oxide film having a crystal structure in which c-axes are aligned in a direction perpendicular to a surface of the film can be used as an electrode for sensing the touch position in the touch panel. The conductive oxide film, which has high conductivity and high transmittance of visible light, contributes to an increase in the sensing accuracy of the touch position in the touch panel.

For example, in the case of forming a touch panel using one substrate and forming a conductive oxide film over the substrate, a touch position can be sensed by a change in current flowing through the conductive oxide film.

Further for example, in the case of forming a touch panel using two substrates and forming a first conductive oxide film over a first substrate and a second conductive oxide film over a second substrate, a touch position can be sensed by contact between the first conductive oxide film and the second conductive oxide film.

Further for example, in the case of forming a touch panel using two substrates and forming a first conductive oxide film over a first substrate and a second conductive oxide film over a second substrate, a touch position can be sensed by a change in capacitance generated between the first conductive oxide film and the second conductive oxide film.

Even in the case of providing a function of sensing a touch position inside a display device or an electronic device, the conductive oxide film having a crystal structure in which c-axes are aligned in a direction perpendicular to a surface of the film can be used as an electrode for sensing the touch position.

For example, two substrates between which a liquid crystal layer is sandwiched are used. In addition, a first conductive oxide film and an electrode for controlling the liquid crystal layer (pixel electrode) are formed over one substrate; thus, the electrode for sensing the touch position and the electrode for controlling the liquid crystal layer can be formed over the same substrate. Further, a second conductive oxide film and an electrode controlling the liquid crystal layer (common electrode) are formed over the other substrate; thus, the electrode for sensing the touch position and the electrode for controlling the liquid crystal layer can be formed over the same substrate. Since the electrodes for sensing the touch position and the electrodes for controlling the liquid crystal layer are placed inside a pixel of a liquid crystal display device, the thickness of the liquid crystal display device can be made small, and the performance of the liquid crystal display device can be increased. Further, the first conductive oxide film can also serve as a pixel electrode, or the second conductive oxide film can also serve as a common electrode.

Further for example, two substrates between which a light-emitting layer is sandwiched are used. In addition, a first conductive oxide film is formed over one substrate, and a second conductive oxide film is formed over the other substrate. Thus, an electrode for sensing the touch position and an electrode for controlling the light-emitting layer can be placed inside a pixel of an organic EL display device.

One embodiment of the present invention disclosed in this specification is a method for forming a conductive oxide film including the steps of: forming a conductive oxide film over a substrate by a sputtering method at a substrate temperature of 200° C. or higher; and performing nitrogen annealing treatment on the conductive oxide film.

One embodiment of the present invention disclosed in this specification is a method for forming a conductive oxide film including the steps of: forming a conductive oxide film over a substrate by a sputtering method in an atmosphere including an argon gas at a substrate temperature of 200° C. or higher; and performing nitrogen annealing treatment on the conductive oxide film.

In the formation methods, as the amount of an argon gas added in the film formation is larger, the conductivity of the conductive oxide film having a crystal structure in which c-axes are aligned in a direction perpendicular to a surface of the film is higher.

In the formation methods, as the amount of an oxygen gas added in the film formation is larger, the conductive oxide film is likely to include more CAAC parts. That is, as the amount of an oxygen gas added in the film formation is larger, the diffraction peak in the vicinity of 31°, which is obtained by X-ray diffraction measurement, is sharper. Note that in this specification, "a conductive oxide film is likely to include more CAAC parts" means "a conductive oxide film is likely to include more crystal parts whose c-axes are aligned in a direction perpendicular to a surface of the film".

It is preferable to appropriately adjust the amount of an oxygen gas and the amount of an argon gas which are added in the formation of the conductive oxide film, in consideration of the conductivity and the transmittance of visible light.

In the formation methods, the ratio of the amount of the added oxygen gas to the amount of the added argon gas in the film formation is particularly preferable 3:7.

In the formation methods, the substrate temperature in the film formation is preferably higher than or equal to 200° C., further preferably higher than or equal to 400° C.

In the formation methods, as the substrate temperature in the film formation is higher, the conductive oxide film is likely to include more CAAC parts. The conductive oxide film including more CAAC parts can have higher transmittance of visible light and higher conductivity.

In the formation methods, nitrogen annealing treatment is performed on the formed conductive oxide film having a crystal structure in which c-axes are aligned in a direction perpendicular to a surface of the film. The nitrogen annealing treatment allows the conductive oxide film having a crystal structure in which c-axes are aligned in a direction perpendicular to a surface of the film to have higher conductivity. That is, the nitrogen annealing treatment can reduce the sheet resistance of the conductive oxide film having a crystal structure in which c-axes are aligned in a direction perpendicular to a surface of the film.

By the nitrogen annealing treatment, oxygen vacancies in the conductive oxide film having a crystal structure in which c-axes are aligned in a direction perpendicular to a surface of the film are increased. The density of free electrons serving as carriers for electric conduction is increased, causing an increase in the carrier density in the conductive oxide film. In other words, the nitrogen annealing treatment increases the conductivity of the conductive oxide film.

In the formation methods, the temperature in the nitrogen annealing treatment is preferably higher than or equal to 350° C., further preferably higher than or equal to 450° C. By increasing the temperature in the nitrogen annealing treatment, higher conductivity of the conductive oxide film having a crystal structure in which c-axes are aligned in a direction perpendicular to a surface of the film can be achieved.

The time for the nitrogen annealing treatment is preferably about one hour.

The nitrogen annealing treatment may be performed in a mixed gas atmosphere of a nitrogen gas and a rare gas.

The nitrogen annealing treatment is preferably performed in an atmosphere not including an oxygen gas.

In the formation methods, the light transmittance and conductivity of the conductive oxide film tend to be controlled by the substrate temperature in the film formation, the amount of an oxygen gas added in the film formation, the amount of an argon gas added in the film formation, whether the nitrogen annealing treatment is performed after the film formation, the temperature of the nitrogen annealing treatment, and the like.

In the formation methods, by setting the substrate temperature in the film formation and the temperature in the nitrogen annealing treatment performed after the film formation at high temperatures, the conductive oxide film with high quality can be obtained easily.

The conductive oxide film formed by any of the above-described formation methods solves the above-described problem.

Note that in this specification, a simple term "perpendicular" includes a range from 85° to 95°.

A conductive oxide film having high conductivity and high transmittance of visible light can be obtained in the following manner: a conductive oxide film is formed at a high substrate temperature and the film is then subjected to nitrogen annealing treatment. In addition, a conductive oxide film having a crystal structure in which c-axes are aligned in a direction perpendicular to a surface of the film can be obtained.

By appropriately selecting the amount of an argon gas added in the film formation, a conductive oxide film with higher conductivity can be obtained.

By appropriately selecting the amount of an oxygen gas added in the film formation, a conductive oxide film with higher crystallinity can be obtained.

BRIEF DESCRIPTION OF THE DRAWINGS

In the accompanying drawings.

DETAILED DESCRIPTION OF THE INVENTION

Figure 1A:
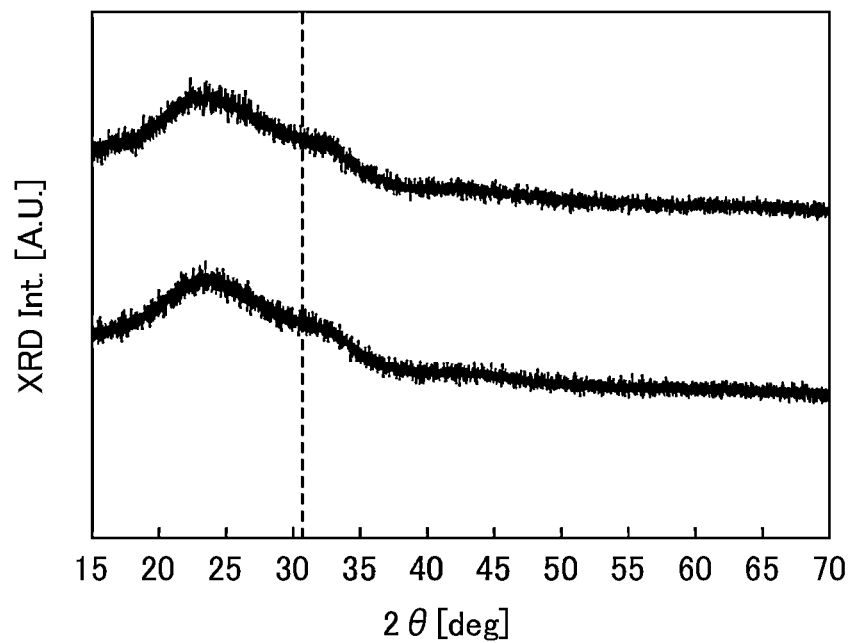
FIGS. 1A and 1B show X-ray diffraction data of conductive oxide films.

Embodiments will be described with reference to the accompanying drawings. Note that the invention is not limited to the following description, and it will be easily understood by those skilled in the art that various changes and modifications can be made without departing from the spirit and scope of the invention. Therefore, the invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, the case of forming a conductive oxide film under a condition in which the percentage of an argon gas in film formation is 100% is described with reference to FIGS. 1A and 1B and Table 1.

In this embodiment, the case of forming an indium zinc oxide film is described as an example.

A method for forming the indium zinc oxide film and conditions for the film formation are described. The indium zinc oxide film was formed by a sputtering method. The conditions are described below.

A target with a composition of In:Zn=2:1 (a molar ratio of $In_2O_3$:ZnO=1:1) was used. The film formation was performed under two conditions of the substrate temperature, 200° C. and 400° C. The reaction pressure was 0.4 Pa, and the DC power was 0.5 kW.

Note that nitrogen annealing treatment was not performed after the film formation.

Table 1 shows the measurement results of the sheet resistances of the indium zinc oxide films formed under the above-described conditions.

TABLE 1

|  | Indium zinc oxide film having a crystal structure in which c-axes are aligned in a direction perpendicular to a surface of the film | |
| --- | --- | --- |
| Argon:Oxygen | 100%:0% | 100%:0% |
| Substrate temperature | 200° C. | 400° C. |

TABLE 1-continued

|  | Indium zinc oxide film having a crystal structure in which c-axes are aligned in a direction perpendicular to a surface of the film | |
| --- | --- | --- |
| Nitrogen annealing treatment | Not performed | Not performed |
| Sheet resistance [Ω/□] | 47.1 | 37.2 |

The sheet resistances of the indium zinc oxide films were measured by the following procedures. First, indium zinc oxide films each having a thickness of approximately 100 nm were formed over substrates under the above-described conditions. Then, the sheet resistance of the indium zinc oxide film formed at the substrate temperature of 200° C. and the sheet resistance of the indium zinc oxide film formed at the substrate temperature of 400° C. were measured by a four-point probe method. Note that the measurement accuracy of a four point probe is 0.2%.

Table 1 shows very favorable measurement results of the sheet resistance: 47.1Ω/□ in the case where the substrate temperature in the film formation is 200° C. and 37.2Ω/□ in the case where the substrate temperature in the film formation is 400° C. These values are enough for the function as conductive oxide films and are within the range appropriate for use in touch panels and electronic paper.

The measurement results show that the sheet resistance in the case where the substrate temperature in the film formation is 400° C. is lower than the sheet resistance in the case where the substrate temperature in the film formation is 200° C. This indicates that as the substrate temperature in the film formation is higher, the conductivity of the indium zinc oxide film is higher.

Note that the indium zinc oxide films formed under the above-described conditions were not subjected to nitrogen annealing treatment after the film formation. If the nitrogen annealing treatment is performed on the indium zinc oxide films formed under the above-described conditions, lower sheet resistance is expected.

Next, the crystal structures of the indium zinc oxide films formed under the above-described conditions and having excellent conductivity were examined.

As a measurement apparatus, a powder X-ray diffractometer (D-8 ADVANCE) manufactured by Bruker AXS was used.

Figure 1B:
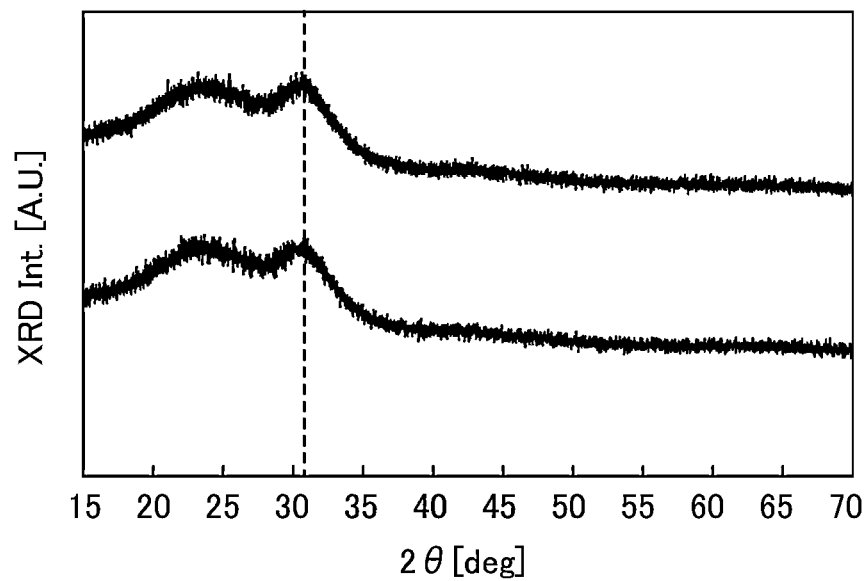

FIGS. 1A and 1B show measurement results of X-ray diffraction (XRD) data of the indium zinc oxide films formed under the above-described conditions. The horizontal axis represents the diffraction angle (2θ (deg)), and the vertical axis represents the XRD intensity (arb. units).

Note that although arbitrary units are used in the vertical axis in FIGS. 1A and 1B, the scale of the vertical axis is common to all spectra.

FIG. 1A shows the measurement results of XRD data in the case where the substrate temperature in the film formation is 200° C., and FIG. 1B shows the measurement results of XRD data in the case where the substrate temperature in the film formation is 400° C. In each of FIGS. 1A and 1B, the upper XRD data indicates the results in the case where heat treatment is performed in a vacuum atmosphere after the formation of the indium zinc oxide film, and the lower XRD data indicates the results in the case where heat treatment is not performed after the formation of the indium zinc oxide film.

From FIGS. 1A and 1B, it can be found that the diffraction peaks obtained by XRD measurement are in the vicinity of 31°.

Thus, in spite of the percentage of an argon gas in the film formation of 100%, by forming an indium zinc oxide film by a sputtering method under the conditions of the substrate temperature of 200° C. or higher, the indium zinc oxide film can have a crystal structure in which c-axes are aligned in a direction perpendicular to a surface of the film.

Further, the diffraction peaks in the vicinity of 31° in FIG. 1B are sharper than those in FIG. 1A, which means that the indium zinc oxide films formed under conditions of the substrate temperature of 400° C. are likely to include more CAAC parts than the indium zinc oxide films formed under conditions of the substrate temperature of 200° C.

From the above-described measurement results, it can be found that the indium zinc oxide film including more CAAC parts has higher conductivity.

The density of defect states in the band gap can be expected to decrease as the indium zinc oxide film includes more CAAC parts.

Next, the absorption coefficient was measured. The absorption coefficient of an indium zinc oxide film having a crystal structure in which c-axes are aligned in a direction perpendicular to a surface of the film and the absorption coefficient of an indium zinc oxide film having an amorphous structure, which is a comparative example, were measured. The values were compared.

As a measurement apparatus, SGA-4 manufactured by Bunkoukeiki Co., Ltd. was used, and as a light source, a Xe lamp was used. Note that the measurement wavelength range was 300 nm to 1200 nm.

The absorption coefficient of the indium zinc oxide film having a crystal structure in which c-axes are aligned in a direction perpendicular to a surface of the film was found to be $2.5 \times 10^{-1}$ cm.

The absorption coefficient of the comparative example, the indium zinc oxide film having an amorphous structure, was found to be $3.0 \times 10^{-1}$ cm.

The absorption coefficient of the indium zinc oxide film having a crystal structure in which c-axes are aligned in a direction perpendicular to a surface of the film was lower than that of the indium zinc oxide film having an amorphous structure.

This indicates that the indium zinc oxide film having a crystal structure in which c-axes are aligned in a direction perpendicular to a surface of the film has more excellent light transmittance than the indium zinc oxide film having an amorphous structure.

As the density of defect states is lower, the number of impurity scattering factors that cause a reduction of mobility is smaller, leading to a lower absorption coefficient. Consequently, as the indium zinc oxide film includes more CAAC parts, the conductivity becomes higher.

Further, as the density of defect states is lower, the absorption of light in the visible light range due to defect states can be suppressed more. Consequently, as the indium zinc oxide film includes more CAAC parts, the transmittance of visible light becomes higher.

All the above-described measurement results suggest that as the substrate temperature in the film formation is higher, the indium zinc oxide film is likely to include more CAAC parts and that the indium zinc oxide film including more CAAC parts more easily achieves increases in both conductivity and transmittance of visible light.

Embodiment 2

In this embodiment, the case of forming a conductive oxide film under a condition in which the percentage of an argon gas in film formation is lower than or equal to 70% is described with reference to FIGS. 2A and 2B, FIG. 3, FIG. 4, FIGS. 5A and 5B, FIG. 11, and Tables 2 to 7.

In this embodiment, the case of forming an indium zinc oxide film is described as an example.

A method for forming the indium zinc oxide film and conditions for the film formation are described. The indium zinc oxide film was formed by a sputtering method. The conditions are described below.

A target with a composition of In:Zn=2:1 (a molar ratio of $In_2O_3$:ZnO=1:1) was used. The film formation was performed under the following two conditions of the gas ratio in film formation: the percentage of an oxygen gas of 100% and the ratio of an argon gas:an oxygen gas=7:3. The film formation was performed under two conditions of the substrate temperature, 25° C. (room temperature) and 200° C. The reaction pressure was 0.4 Pa, and the DC power was 0.5 kW.

The indium zinc oxide films used for the measurement in FIGS. 2A and 2B, FIG. 3, FIG. 4, FIGS. 5A and 5B, FIG. 11, and Tables 2 to 7 were each formed under any of the above-described conditions.

The measurement results of the case in which nitrogen annealing treatment was performed on the indium zinc oxide film formed under any of the above-described conditions after the film formation are also shown.

Figure 2A:
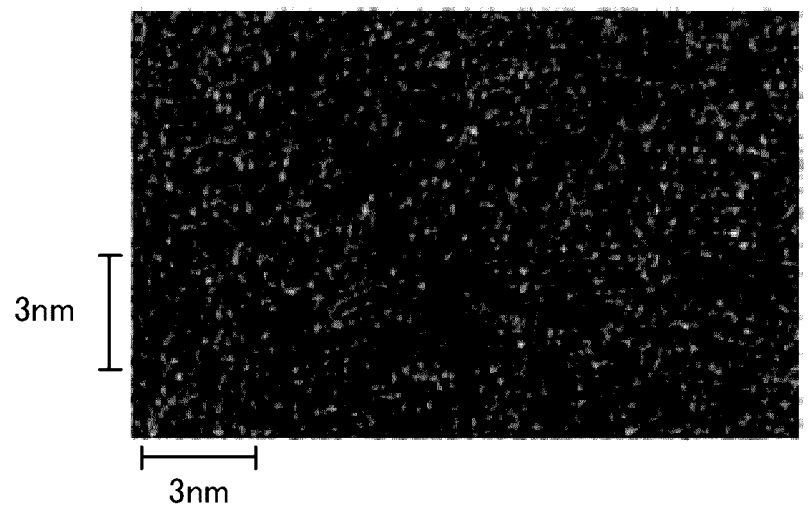
FIGS. 2A and 2B are cross-sectional TEM photographs of conductive oxide films.
Figure 2B:
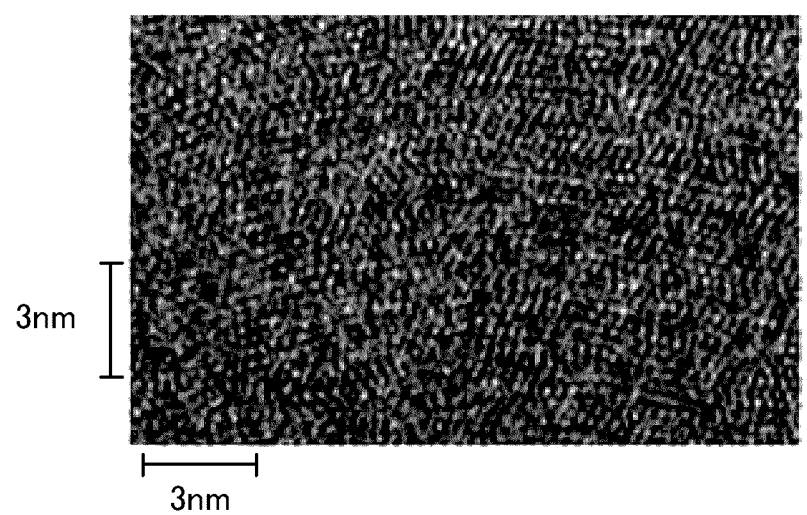
Figure 3:
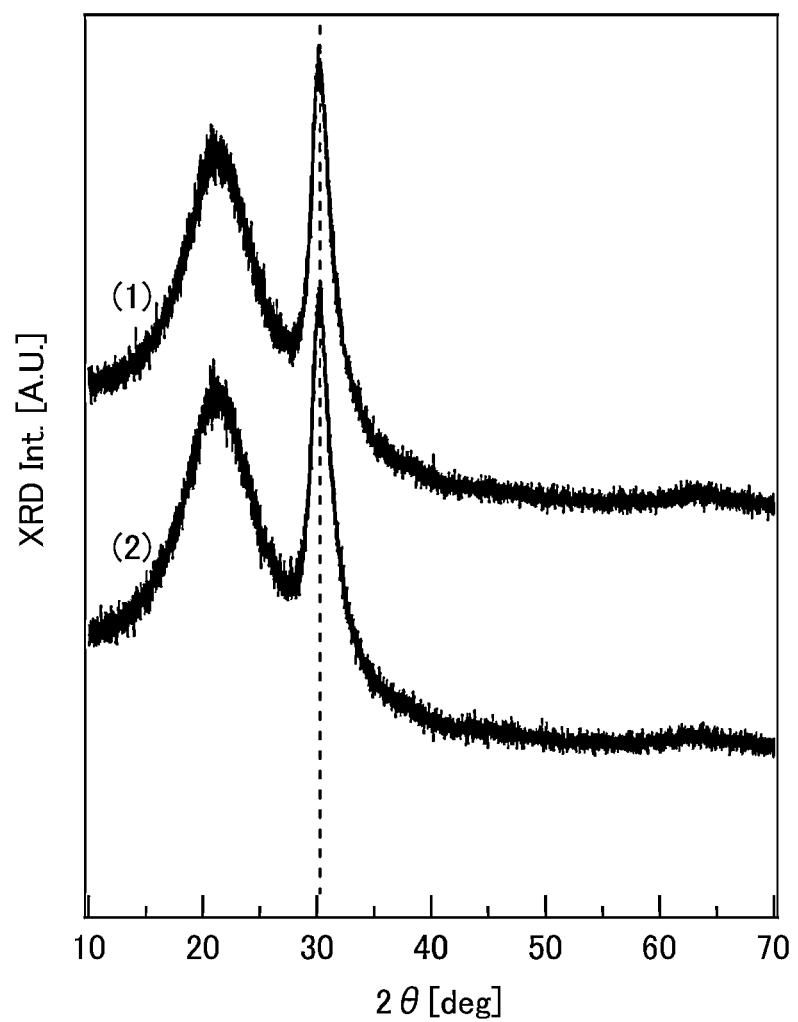
FIG. 3 shows X-ray diffraction data of conductive oxide films.

FIGS. 2A and 2B are cross-sectional TEM photographs, and FIG. 3 shows measurement results of XRD data.

The film formation conditions of the indium zinc oxide films shown in FIGS. 2A and 2B and FIG. 3 are as follows: the composition of the target is In:Zn=2:1, the percentage of an oxygen gas in film formation is 100%, the substrate temperature is 200° C., the reaction pressure is 0.4 Pa, and the DC power is 0.5 kW.

Note that the nitrogen annealing treatment was not performed on these indium zinc oxide films after the film formation.

FIG. 2A is a cross-sectional TEM photograph of an indium zinc oxide film formed in the following manner: a silicon oxynitride film is formed as a base film over a substrate, and then the indium zinc oxide film is formed over the base film of the silicon oxynitride film. FIG. 2B is a cross-sectional TEM photograph of an indium zinc oxide film formed in the following manner: a silicon oxide film is formed as a base film over a substrate, and then the indium zinc oxide film is formed over the base film of the silicon oxide film.

As is apparent from FIGS. 2A and 2B, the formed indium zinc oxide films each have a crystal structure in which c-axes are aligned in a direction perpendicular to a surface of the film. Crystal parts are neatly aligned in the perpendicular direction. Accordingly, the indium zinc oxide films formed under the above-described conditions are indium zinc oxide films having a crystal structure in which c-axes are aligned in a direction perpendicular to a surface of the film.

FIG. 3 shows XRD data of the indium zinc oxide films shown in FIGS. 2A and 2B and having a crystal structure in which c-axes are aligned in a direction perpendicular to a surface of the film. In FIG. 3, (1) corresponds to the indium zinc oxide film in FIG. 2A, and (2) corresponds to the indium zinc oxide film in FIG. 2B. For the measurement apparatus and the measurement method, Embodiment 1 can be referred to.

In FIG. 3, (1) represents the XRD data of the indium zinc oxide film formed in the following manner: a silicon oxynitride film was formed as a base film over a substrate, and then the indium zinc oxide film is formed over the base film of the silicon oxynitride film. In addition, (2) in FIG. 3 represents the XRD data of the indium zinc oxide film formed in the following manner: a silicon oxide film is formed as a base film over a substrate, and then the indium zinc oxide film is formed over the base film of the silicon oxide film.

In FIG. 3, the diffraction peaks obtained by XRD measurement are in the vicinity of 31°.

It can be found from the measurement results of the cross-sectional TEM photographs in FIGS. 2A and 2B and the measurement results of the XRD data in FIG. 3 that the indium zinc oxide films formed by a sputtering method under conditions of the substrate temperature of 200° C. or higher include CAAC parts.

The comparison between FIGS. 1A and 1B and FIGS. 3A and 3B reveals the fact that as the amount of an oxygen gas added in film formation is larger, the indium zinc oxide film is likely to include more CAAC parts.

Figure 4:
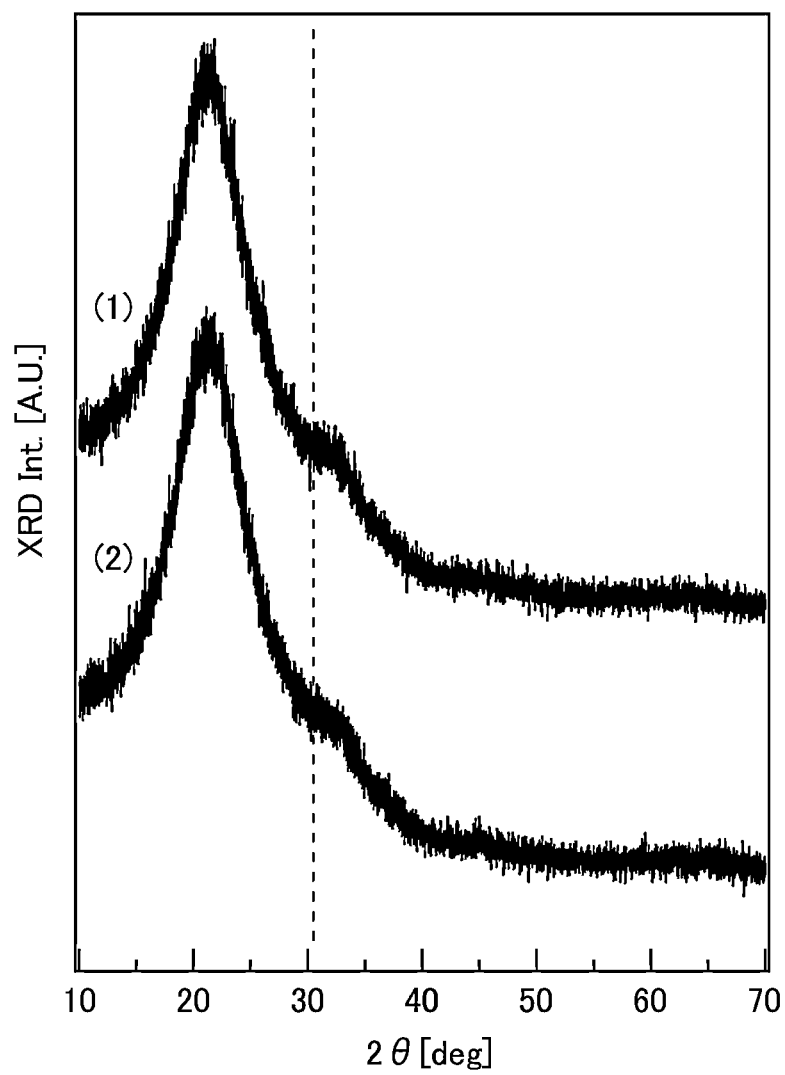
FIG. 4 shows X-ray diffraction data of conductive oxide films.

Next, measurement results of XRD data are shown in FIG. 4.

The film formation conditions of the indium zinc oxide films shown in FIG. 4 are as follows: the composition of the target is In:Zn=2:1, the gas ratio is an argon gas:an oxygen gas=7:3, the substrate temperature is 25° C. (room temperature), the reaction pressure is 0.4 Pa, and the DC power is 0.5 kW.

Note that the nitrogen annealing treatment was not performed on these indium zinc oxide films after the film formation.

In FIG. 4, (1) represents the XRD data of the indium zinc oxide film formed in the following manner: a silicon oxynitride film was formed as a base film over a substrate, and then the indium zinc oxide film is formed over the base film of the silicon oxynitride film. In addition, (2) in FIG. 4 represents the XRD data of the indium zinc oxide film formed in the following manner: a silicon oxide film is formed as a base film over a substrate, and then the indium zinc oxide film is formed over the base film of the silicon oxide film.

As is apparent from FIG. 4, diffraction peaks were not substantially observed in the vicinity of 31° in the indium zinc oxide films after the film formation by XRD measurement. As compared with FIG. 3, the difference of the diffraction peaks in the vicinity of 31° is obvious. Consequently, the indium zinc oxide films obtained under the above-described film formation conditions are indium zinc oxide films having an amorphous structure.

From the comparison between XRD data in FIG. 3 and that in FIG. 4, it can be found that in the case where the amount of an oxygen gas added in film formation is small and the substrate temperature is low (approximately room temperature), the indium zinc oxide film does not include CAAC parts and has an amorphous structure.

From the comparison between XRD data in FIGS. 1A and 1B and that in FIG. 3, it can be found that when the amount of an oxygen gas in film formation is small, the indium zinc oxide film is unlikely to include CAAC parts.

Figure 5A:
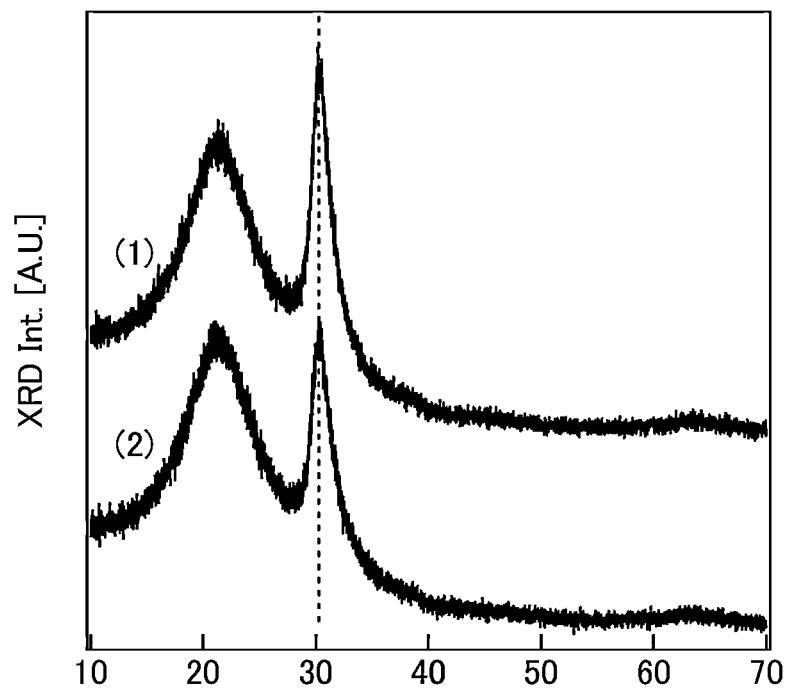
FIGS. 5A and 5B each show X-ray diffraction data of conductive oxide films.
Figure 5B:
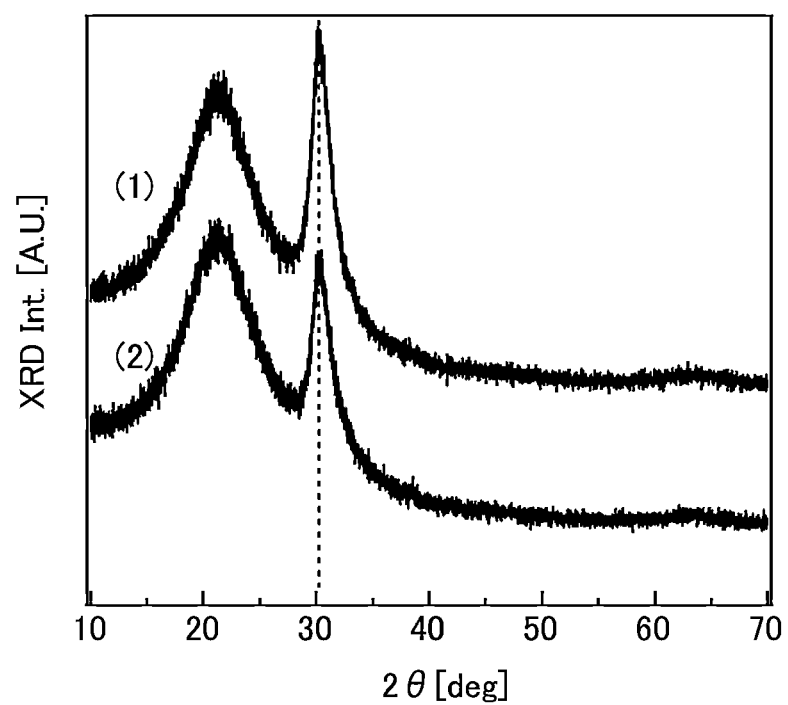
Figure 11:
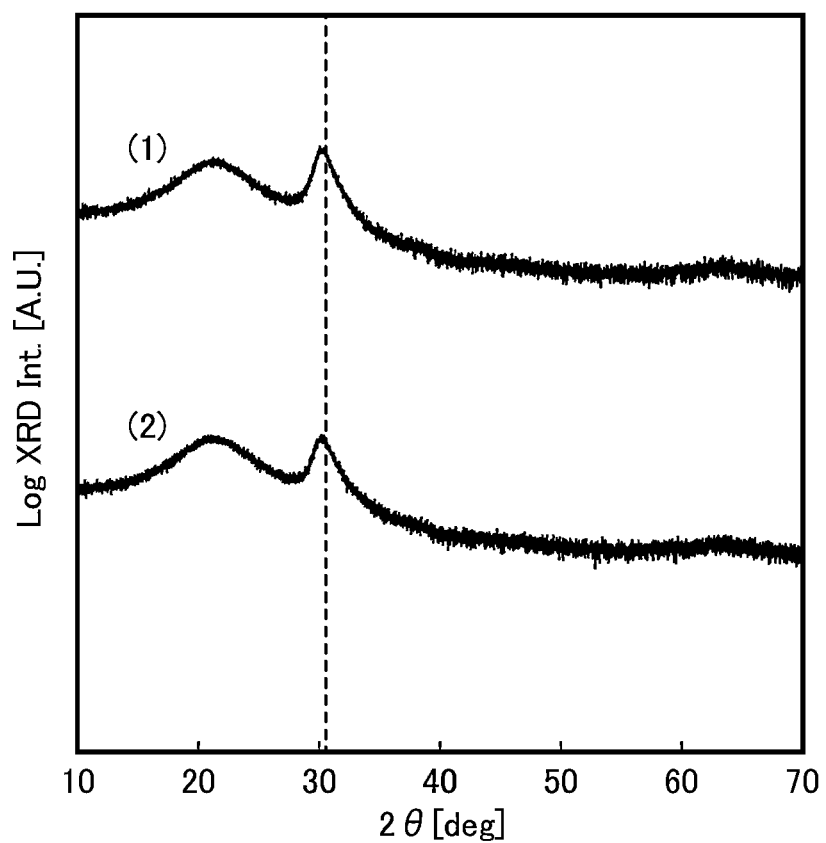
FIG. 11 shows X-ray diffraction data of conductive oxide films.

Next, FIGS. 5A and 5B and FIG. 11 show measurement results of XRD data of indium zinc oxide films formed by a sputtering method in an atmosphere including an argon gas under conditions of the substrate temperature of higher than or equal to 200° C. and then subjected to nitrogen annealing treatment.

Film formation conditions of the indium zinc oxide films shown in FIGS. 5A and 5B are as follows: the composition of the target is In:Zn=2:1, the gas ratio is an argon gas:an oxygen gas=7:3, the substrate temperature is 200° C., the reaction pressure is 0.4 Pa, and the DC power is 0.5 kW.

FIG. 5A shows the measurement results of the XRD data in the case where the temperature of the nitrogen annealing treatment is 350° C. and the time of the nitrogen annealing treatment is 1 hour. FIG. 5B shows the measurement results of the XRD data in the case where the temperature of the nitrogen annealing treatment is 450° C. and the time of the nitrogen annealing treatment is 1 hour.

The film formation conditions of the indium zinc oxide films shown in FIG. 11 are as follows: the composition of the target is In:Zn=2:1, the percentage of an oxygen gas in film formation is 100%, the substrate temperature is 200° C., the reaction pressure is 0.4 Pa, and the DC power is 0.5 kW. FIG. 11 shows the measurement results of the XRD data in the case where the temperature of the nitrogen annealing treatment is 350° C. and the time of the nitrogen annealing treatment is 1 hour.

For the measurement apparatus and the measurement method, Embodiment 1 can be referred to.

In FIGS. 5A and 5B and FIG. 11, (1) represents the XRD data of the indium zinc oxide film formed over a base film of a silicon oxynitride film.

In FIGS. 5A and 5B and FIG. 11, (2) represents the XRD data of the indium zinc oxide film formed over the base film of the silicon oxide film.

In FIGS. 5A and 5B, the diffraction peaks obtained by XRD measurement are in the vicinity of 31°.

These results show that even if nitrogen annealing treatment is performed on an indium zinc oxide film having a crystal structure in which c-axes are aligned in a direction perpendicular to a surface of the film, the crystal structure in which c-axes are aligned in a direction perpendicular to a surface of the film is maintained.

Next, the measured sheet resistances of the indium zinc oxide films used in FIGS. 5A and 5B are shown in Table 2 and Table 3. The sheet resistance of the indium zinc oxide film on which nitrogen annealing treatment is performed at a treatment temperature of 350° C. for 1 hour and the sheet resistance of the indium zinc oxide film on which nitrogen annealing treatment is performed at a treatment temperature of 450° C. for 1 hour are compared.

TABLE 2

| | Indium zinc oxide film having a crystal structure in which c-axes are aligned in a direction perpendicular to a surface of the film |
|---|---|
| Argon:Oxygen | 70%:30% |
| Substrate temperature | 200° C. |
| Nitrogen annealing treatment | Performed at 350° C. |
| Base film | Silicon oxide film |
| Sheet resistance [Ω/□] | 2830 |

TABLE 3

| | Indium zinc oxide film having a crystal structure in which c-axes are aligned in a direction perpendicular to a surface of the film |
|---|---|
| Argon:Oxygen | 70%:30% |
| Substrate temperature | 200° C. |
| Nitrogen annealing treatment | Performed at 450° C. |

TABLE 3-continued

| | Indium zinc oxide film having a crystal structure in which c-axes are aligned in a direction perpendicular to a surface of the film |
|---|---|
| Base film | Silicon oxide film |
| Sheet resistance [Ω/□] | 2300 |

For the measurement apparatus and the measurement method, Embodiment 1 can be referred to.

The indium zinc oxide film shown in Table 2 corresponds to the indium zinc oxide film having the XRD data of (2) in FIG. 5A.

The indium zinc oxide film shown in Table 3 corresponds to the indium zinc oxide film having the XRD data of (2) in FIG. 5B.

The sheet resistance in the case where the nitrogen annealing treatment temperature is 350° C. is approximately 2830Ω/□, while the sheet resistance in the case where the nitrogen annealing treatment temperature is 450° C. is approximately 2300Ω/□. This shows that higher nitrogen annealing treatment temperature causes lower sheet resistance.

Accordingly, higher nitrogen annealing treatment temperature offers an indium zinc oxide film with higher conductivity.

Next, the measured sheet resistances of the indium zinc oxide films used in FIG. 4 and FIG. 11 are shown in Table 4 and Table 5.

The indium zinc oxide film having an amorphous structure shown in Table 4 corresponds to the indium zinc oxide film having the XRD data of (2) in FIG. 4. The indium zinc oxide film having a crystal structure in which c-axes are aligned in a direction perpendicular to a surface of the film shown in Table 4 corresponds to the indium zinc oxide film having the XRD data of (2) in FIG. 11.

TABLE 4

| | Indium zinc oxide film having a crystal structure in which c-axes are aligned in a direction perpendicular to a surface of the film | Indium zinc oxide film having an amorphous structure |
|---|---|---|
| Argon:Oxygen | 0%:100% | 70%:30% |
| Substrate temperature | 200° C. | Room temperature |
| Nitrogen annealing treatment | Performed at 350° C. | Not performed |
| Base film | Silicon oxide film | Silicon oxide film |
| Sheet resistance [Ω/□] | 1270 | 5M or higher |
| Thickness [nm] | 100.89 | 99.20 |

The indium zinc oxide film having an amorphous structure shown in Table 5 corresponds to the indium zinc oxide film having the XRD data of (1) in FIG. 4. The indium zinc oxide film having a crystal structure in which c-axes are aligned in a direction perpendicular to a surface of the film shown in Table 5 corresponds to the indium zinc oxide film having the XRD data of (1) in FIG. 11.

TABLE 5

|  | Indium zinc oxide film having a crystal structure in which c-axes are aligned in a direction perpendicular to a surface of the film | Indium zinc oxide film having an amorphous structure |
| --- | --- | --- |
| Argon:Oxygen | 0%:100% | 70%:30% |
| Substrate temperature | 200° C. | Room temperature |
| Nitrogen annealing treatment | Performed at 350° C | Not performed |
| Base film | Silicon oxynitride film | Silicon oxynitride film |
| Sheet resistance [Ω/□] | 1100 | 5M or higher |
| Thickness [nm] | 100.07 | 99.34 |

As shown in Table 4 and Table 5, the sheet resistances of the indium zinc oxide films having a crystal structure in which c-axes are aligned in a direction perpendicular to a surface of the films are approximately 1000Ω/□, while the sheet resistances of the indium zinc oxide films having an amorphous structure are 5M Ω/□ or higher. In other words, the sheet resistances of the indium zinc oxide films having a crystal structure in which c-axes are aligned in a direction perpendicular to a surface of the films are by three orders of magnitude lower than those of the indium zinc oxide films having an amorphous structure.

Thus, the indium zinc oxide film having a crystal structure in which c-axes are aligned in a direction perpendicular to a surface of the film has higher conductivity than the indium zinc oxide film having an amorphous structure.

Next, the measured band gaps of the indium zinc oxide films used in FIG. 3, FIG. 4, and FIG. 11 are shown in Table 6 and Table 7.

TABLE 6

|  | Indium zinc oxide film having a crystal structure in which c-axes are aligned in a direction perpendicular to a surface of the film | | Indium zinc oxide film having an amorphous structure |
| --- | --- | --- | --- |
| Argon:Oxygen | 0%:100% | 0%:100% | 70%:30% |
| Substrate temperature | 200° C. | 200° C. | Room temperature |
| Nitrogen annealing treatment | Not performed | Performed at 350° C. | Not performed |
| Base film | Silicon oxide film | Silicon oxide film | Silicon oxide film |
| Band gap [eV] | 2.56 | 2.61 | 2.52 |
| Thickness [nm] | 99.40 | 100.89 | 99.20 |

TABLE 7

|  | Indium zinc oxide film having a crystal structure in which c-axes are aligned in a direction perpendicular to a surface of the film | | Indium zinc oxide film having an amorphous structure |
| --- | --- | --- | --- |
| Argon:Oxygen | 0%:100% | 0%:100% | 70%:30% |
| Substrate temperature | 200° C. | 200° C. | Room temperature |
| Nitrogen annealing treatment | Not performed | Performed at 350° C. | Not performed |

TABLE 7-continued

|  | Indium zinc oxide film having a crystal structure in which c-axes are aligned in a direction perpendicular to a surface of the film | | Indium zinc oxide film having an amorphous structure |
| --- | --- | --- | --- |
| Base film | Silicon oxynitride film | Silicon oxynitride film | Silicon oxynitride film |
| Band gap [eV] | 2.53 | 2.62 | 2.45 |
| Thickness [nm] | 99.92 | 100.07 | 99.34 |

The indium zinc oxide film having an amorphous structure shown in Table 6 corresponds to the indium zinc oxide film having the XRD data of (2) in FIG. 4. The indium zinc oxide film having an amorphous structure shown in Table 7 corresponds to the indium zinc oxide film having the XRD data of (1) in FIG. 4.

The band gap of the indium zinc oxide film having an amorphous structure formed over the base film of the silicon oxide film, which corresponds to (2) in FIG. 4, is 2.52 eV.

The band gap of the indium zinc oxide film having an amorphous structure formed over the base film of the silicon oxynitride film, which corresponds to (1) in FIG. 4, is 2.45 eV.

The indium zinc oxide films having a crystal structure in which c-axes are aligned in a direction perpendicular to a surface of the film shown in Table 6 correspond to the indium zinc oxide film having the XRD data of (2) in FIG. 3 and the indium zinc oxide film having the XRD data of (2) in FIG. 11. The indium zinc oxide films having a crystal structure in which c-axes are aligned in a direction perpendicular to a surface of the film shown in Table 7 correspond to the indium zinc oxide film having the XRD data of (1) in FIG. 3 and the indium zinc oxide film having the XRD data of (1) in FIG. 11.

The band gap of the CAAC indium zinc oxide film formed over the base film of the silicon oxide film, which corresponds to (2) in FIG. 3, is 2.56 eV. The band gap of the CAAC indium zinc oxide film formed over the base film of the silicon oxide film, which corresponds to (2) in FIG. 11, is 2.61 eV.

The band gaps of the indium zinc oxide films having a crystal structure in which c-axes are aligned in a direction perpendicular to a surface of the films is larger by about 0.05 eV than that of the indium zinc oxide film having an amorphous structure.

The band gap of the CAAC indium zinc oxide film formed over the base film of the silicon oxynitride film, which corresponds to (1) in FIG. 3, is 2.53 eV. The band gap of the CAAC indium zinc oxide film formed over the base film of the silicon oxynitride film, which corresponds to (1) in FIG. 11, is 2.62 eV.

The band gaps of the indium zinc oxide films having a crystal structure in which c-axes are aligned in a direction perpendicular to a surface of the films is larger by about 0.1 eV than that of the indium zinc oxide film having an amorphous structure.

From the measurement results in Table 6 and Table 7, it can be found that the band gaps of the indium zinc oxide films having a crystal structure in which c-axes are aligned in a direction perpendicular to a surface of the films were larger than those of the indium zinc oxide films having an amorphous structure.

Further, as shown in Table 6 and Table 7, the band gaps of the indium zinc oxide films that have a crystal structure in which c-axes are aligned in a direction perpendicular to a surface of the films and are subjected to nitrogen annealing treatment at 350° C. after the film formation is larger than that of the indium zinc oxide films that have a crystal structure in which c-axes are aligned in a direction perpendicular to a surface of the films and are not subjected to nitrogen annealing treatment after the film formation.

Thus, the indium zinc oxide films having a crystal structure in which c-axes are aligned in a direction perpendicular to a surface of the film have higher light transmittance than the indium zinc oxide film having an amorphous structure.

Further, the indium zinc oxide film subjected to nitrogen annealing treatment has higher light transmittance than the indium zinc oxide film not subjected to nitrogen annealing treatment. Consequently, it is suggested that the nitrogen annealing treatment is efficient for increasing not only the conductivity of the indium zinc oxide film but also the light transmittance thereof.

This embodiment can be implemented in appropriate combination with any of the other embodiments described in this specification.

Embodiment 3

In this embodiment, an example of using the conductive oxide film of one embodiment of the present invention in an organic EL display device having a touch panel is described with reference to FIGS. 6A and 6B and FIGS. 7A and 7B.

As an example, an analog resistive touch panel is described with reference to FIGS. 6A and 6B.

Figure 6A:
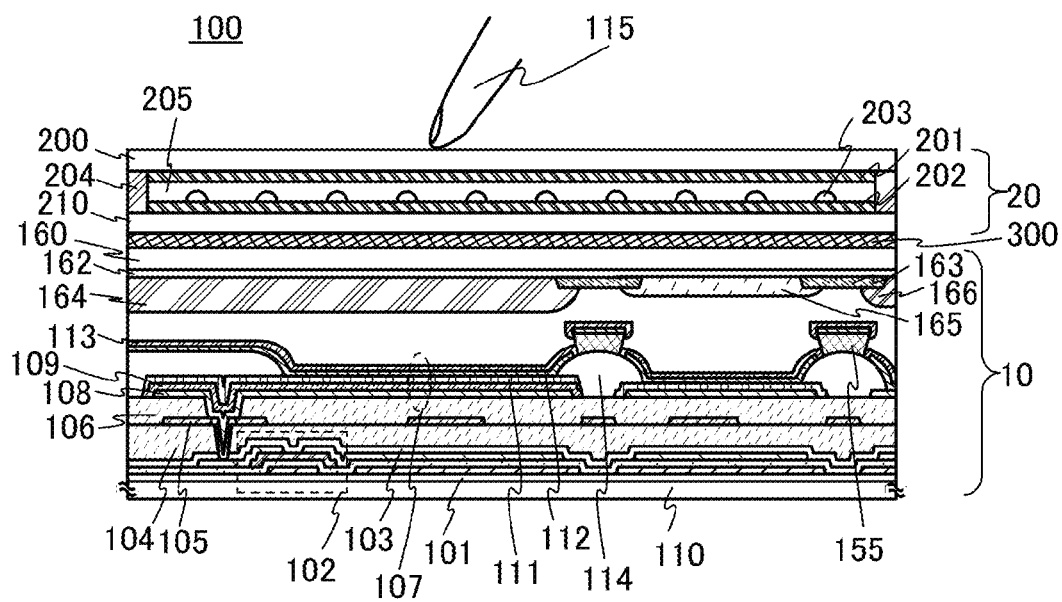
FIGS. 6A and 6B illustrate an organic EL display device.
Figure 6B:
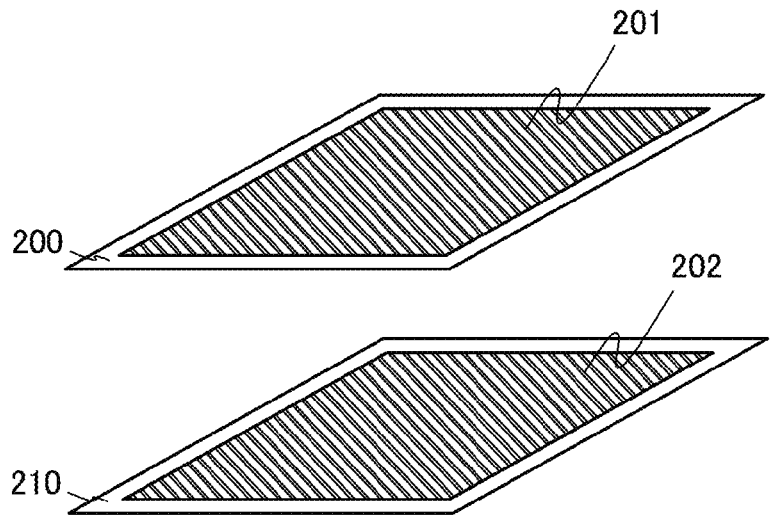

FIG. 6A is a cross-sectional view of an organic EL display device 100 having a touch panel 20, and FIG. 6B illustrates the placement of conductive oxide films in the touch panel 20.

The organic EL display device 100 includes an organic EL display panel 10 and a touch panel 20. Although the organic EL display panel 10 and the touch panel 20 are directly bonded with an adhesive layer 300 provided therebetween in FIG. 6A, another structure may be employed. Part of the organic EL display panel 10 may be bonded to part of the touch panel 20 with an adhesive layer.

As illustrated in FIG. 6A, the touch panel 20 includes a first substrate 200, a second substrate 210, a first conductive oxide film 201, a second conductive oxide film 202, a dot spacer 203, a sealant 204, and an air gap 205.

Further, as illustrated in FIG. 6A, the organic EL display panel 10 includes a first substrate 110, a base layer 101 over the first substrate 110, a transistor 102 and an insulating layer 103 over the base layer 101, a first interlayer film 104 over the insulating layer 103, a wiring 105 electrically connected to the transistor 102, a second interlayer film 106 over the wiring 105 and the first interlayer film 104, a light-emitting element 107 electrically connected to the wiring 105, and a first partition 114 and a second partition 155 which isolate the light-emitting element 107. In addition, a second substrate 160 is included as an opposite substrate of the first substrate 110. The second substrate 160 is provided with a base layer 162, a black matrix 163, a red color filter 164, a green color filter 165, and a blue color filter 166. The light-emitting element 107 includes a reflective electrode 108, a first microcavity layer 109, a second microcavity layer 111, a light-emitting layer 112, and a cathode 113.

As materials of the first conductive oxide film 201 and the second conductive oxide film 202, an indium zinc oxide is particularly preferably used.

Note that the conductive oxide films having a crystal structure in which c-axes are aligned in a direction perpendicular to a surface of the film, described in Embodiments 1 and 2, can be used as the first conductive oxide film 201, the second conductive oxide film 202, the cathode 13, the first microcavity layer 109, and the second microcavity layer 111. The conductive oxide films have high conductivity and high transmittance of visible light.

As a material that can be used as the dot spacer 203, a light-transmitting elastic material is preferably used; an insulating synthetic resin such as an epoxy resin or an acrylic resin is preferably used. The dot spacer 203 may contain a microparticle of an organic substance, silicon (Si), carbon (C), magnesium (Mg), or the like.

The dot spacer 203 can reduce impact between the first substrate 200 and the second substrate 210 given when an input means 115 touches the touch panel 20. In addition, the dot spacer 203 makes it easy for the first substrate 200 to return to the original position after the input means 115 touches the touch panel 20.

The dot spacer 203 may be formed on either the second substrate 210 side or the first substrate 200 side. Alternatively, the dot spacer 203 may be formed on both the first substrate 200 side and the second substrate 210 side.

As examples of materials that can be used as the first substrate 200 and the second substrate 210, a plastic film, glass, thin plate glass, reinforced glass, and the like can be given. The plastic film is not particularly limited but preferably one having a light-transmitting property and an upper temperature limit of 200° C. or higher. As the plastic film, polyethylene terephthalate (PET, upper temperature limit: approximately 200° C.), polyethylene naphthalate (PEN, upper temperature limit: approximately 200° C.), polyether sulfone (PES, upper temperature limit: approximately 200° C.), cyclic olefin copolymer (COC, upper temperature limit: approximately 200° C.), triacetylcellulose (TAC, upper temperature limit: approximately 200° C.), polyimide (PI, upper temperature limit: approximately 200° C.), polyester (upper temperature limit: approximately 240° C.), a silicone resin (upper temperature limit: approximately 500° C.), or the like is preferably used.

Alternatively, a plastic film having an upper temperature limit of 200° C. or lower can also be used. Preferred examples of the plastic film having an upper temperature limit of 200° C. or lower include polyvinyl alcohol (PVA, upper temperature limit: approximately 40° C. to 60° C.), polystyrene (PS, upper temperature limit: approximately 70° C. to 90° C.), biaxially oriented polystyrene sheet (OPS, upper temperature limit: approximately 80° C.), polyvinyl chloride (PVC, upper temperature limit: approximately 60° C. to 80° C.), polycarbonate (PC, upper temperature limit: approximately 120° C. to 130° C.), polymethylmethacrylate (PMMA, upper temperature limit: approximately 70° C. to 90° C.), and the like.

In the case of using the plastic film having an upper temperature limit of 200° C. or lower, a base film is preferably formed between the conductive oxide film and the substrate. As the base film, a silicon oxide film, a silicon oxynitride film, an aluminum oxide film, or the like can be used. By forming the base film between the conductive oxide film and the substrate, the influence of gas generated from the plastic film or the like can be reduced. In addition, defects in the crystal of the conductive oxide film can be reduced.

A preferred material that can be used as the sealant 204 includes but not limited to a double adhesive tape (DAT) or the like.

The sealant 204 is provided on an edge portion of one surface of the first substrate 200 and an edge portion of one surface of the second substrate 210. The edge portions of the first substrate 200 and the second substrate 210 are bonded to each other. The sealant 204 separates the first conductive oxide film 201 from the second conductive oxide film 202 during the time when the input means 115 does not touch the touch panel 20.

As illustrated in FIG. 6B, the first conductive oxide film 201 is formed evenly on a surface of the first substrate 200. The second conductive oxide film 202 is formed evenly on a surface of the second substrate 210.

A method for sensing the touch position in the touch panel 20 is described. In the case of an analog resistive type, voltage is applied to one of the first conductive oxide film 201 and the second conductive oxide film 202, and a potential is detected from the other of the conductive oxide films. When the input means 115 touches a surface of the first substrate 200 in the state where the air gap 205 and the dot spacer 203 separate the first conductive oxide film 201 from the second conductive oxide film 202, the first conductive oxide film 201 bends in the direction of the second conductive oxide film 202, and the first conductive oxide film 201 contacts with the second conductive oxide film 202. At this time, the first conductive oxide film 201 and the second conductive oxide film 202 are brought into conduction. By detecting the potential of the conducting point, the touch position can be sensed. Note that since the conductive oxide films have high conductivity and high transmittance of visible light, the sensing accuracy of the touch position in the touch panel 20 can be increased.

For example, in the case where the touch panel 20 is a 4-wire panel, electrodes (not necessarily transparent) are provided in four locations: over and under the first conductive oxide film 201 and on sides of the second conductive oxide film 202. Then, voltage is applied to only one of the conductive oxide films, and the potential of the touch position is detected from the other conductive oxide film; thus, the touch position can be sensed. The touch panel 20 may be a 5-wire, 7-wire, or 8-wire panel, without being limited to a 4-wire panel.

Figure 7A:
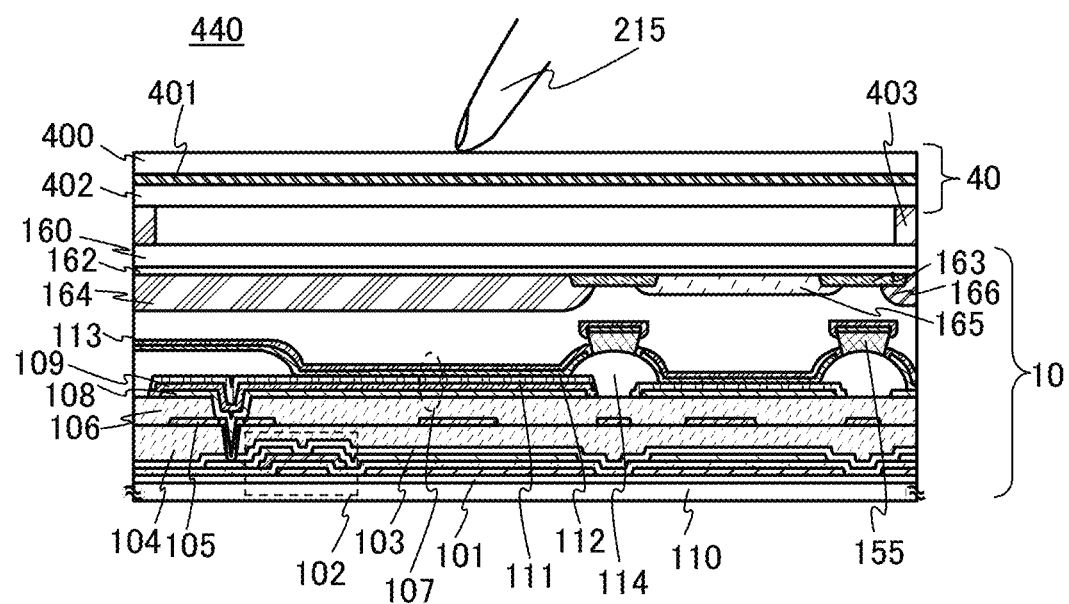
FIGS. 7A and 7B illustrate an organic EL display device.
Figure 7B:
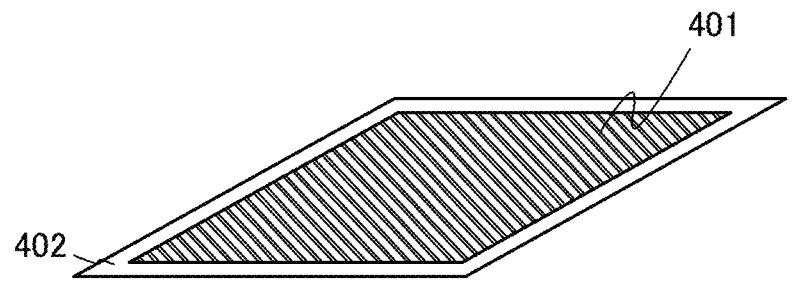

Alternatively, the touch panel 20 may be a surface capacitive touch panel 40 as illustrated in FIGS. 7A and 7B.

An example of using the touch panel 40 in an organic EL display device is described with reference to FIGS. 7A and 7B.

FIG. 7A is a cross-sectional view of an organic EL display device 440 having the touch panel 40, and FIG. 7B illustrates the placement of conductive oxide films in the touch panel 40.

As illustrated in FIG. 7A, the touch panel 40 includes a first substrate 400, a conductive oxide film 401, and a second substrate 402.

As a material of the conductive oxide film 401, an indium zinc oxide is particularly preferably used.

Any of the conductive oxide films having a crystal structure in which c-axes are aligned in a direction perpendicular to a surface of the film, described in Embodiments 1 and 2, can be used as the conductive oxide film 401. The conductive oxide films have high conductivity and high transmittance of visible light. Accordingly, the sensing accuracy of the touch position in the touch panel 40 can be increased.

Any of the materials similar to those of the touch panel 20 can be used as the first substrate 400 and the second substrate 402.

In the organic EL display device 440 illustrated in FIG. 7A, part of the organic EL display panel 10 is bonded to part of the touch panel 40 with an adhesive layer 403. Although a space is formed in the non-bonded area, the conductive oxide film having a crystal structure in which c-axes are aligned in a direction perpendicular to a surface of the film can prevent a reduction in light transmittance.

As illustrated in FIG. 7B, the conductive oxide film 401 is formed evenly on a surface of the second substrate 402.

A method for sensing the touch position in the touch panel 40 is described. Electrodes (not necessarily transparent) are provided at four corners of the conductive oxide film 401. Since the conductive oxide film 401 is formed evenly on the surface of the second substrate 402, when voltage is applied to these four electrodes, an electric field is evenly generated in the touch panel 40. At this time, little current flows in the conductive oxide film 401.

When the input means 215 touches a surface of the first substrate 400, a current flowing through the conductive oxide film 401 is changed (a weak electric current flows). Since capacitance is generated between the input means 215 and the conductive oxide film 401 at this time, capacitance (total capacitance) of the touch panel 40 is increased, so that the amount of current flowing in the electrodes at four corners of the conductive oxide film 401 changes. Since a closed circuit is formed of the conductive oxide film 401, the first substrate 400, the input means 215, and GND, the current flowing through the electrodes at four corners is sensed, and the touch position can be precisely obtained from the ratio of the distances between the touch position and the electrodes at four corners.

Note that in the capacitive touch panel 40, the touch position can be sensed even when the input means 215 does not directly touch the first substrate 400 but only comes close to the first substrate 400.

Although the case of using an analog resistive touch panel as the touch panel 20 and a surface capacitive touch panel as the touch panel 40 have been described in this embodiment, the structure of the touch panel 20 and the touch panel 40 are not limited to these structures. In either case, any of the conductive oxide films having a crystal structure in which c-axes are aligned in a direction perpendicular to a surface of the film, described in Embodiments 1 and 2, can be used as the conductive oxide film in the touch panel.

The structures of the out-cell organic EL display devices in which the touch panel 20 or the touch panel 40 is externally attached to the organic EL display panel 10 have been described in this embodiment; however, the structure is not limited to the out-cell structure. An in-cell or on-cell organic EL display device having a touch panel function similar to that of the touch panel 20 or the touch panel 40 may be formed.

In the case where the touch panel function similar to that of the touch panel 20 or the touch panel 40 is provided inside an organic EL display device, the conductive oxide film serves as a touch electrode (sensor electrode). By forming an anode (or a cathode) and a conductive oxide film over the same substrate, the control of a light-emitting layer for displaying images on the organic EL display device and the sensing of the touch position of the input means on the display panel can be conducted over the same substrate. The conductive oxide film can serve as both the touch electrode and the electrode for controlling the light-emitting layer. Thus, when a touch panel function is provided inside an organic EL display device, there is no need to additionally provide a touch panel over the organic EL display panel; accordingly, the thickness of the whole organic EL display device can be reduced and further the weight of the whole organic EL display device can be reduced.

By using the conductive oxide film having a crystal structure in which c-axes are aligned in a direction perpendicular to a surface of the film and having high conductivity and high transmittance of visible light in a touch panel and an organic EL display panel, the organic EL display device can have high performance.

This embodiment can be implemented in appropriate combination with any of the other embodiments described in this specification.

Embodiment 4

In this embodiment, electronic devices having a touch panel capable of multi-touch input are described with reference to FIGS. 8A to 8C, FIGS. 9A to 9C, and FIGS. 10A to 10C. Examples of electronic devices include a portable television device (also referred to as a television or a television receiver), a camera such as a digital camera or a digital video camera, a digital photo frame, a mobile phone, a portable game machine, a portable information terminal, an audio reproducing device, a game machine (such as a pachinko machine or a slot machine), a game console, and the like. Any of the conductive oxide films having a crystal structure in which c-axes are aligned in a direction perpendicular to a surface of the film, described in Embodiments 1 and 2, can be used in these electronic devices.

Display panels incorporated in these electronic devices may be liquid crystal display panels or organic EL display panels.

Figure 8A:
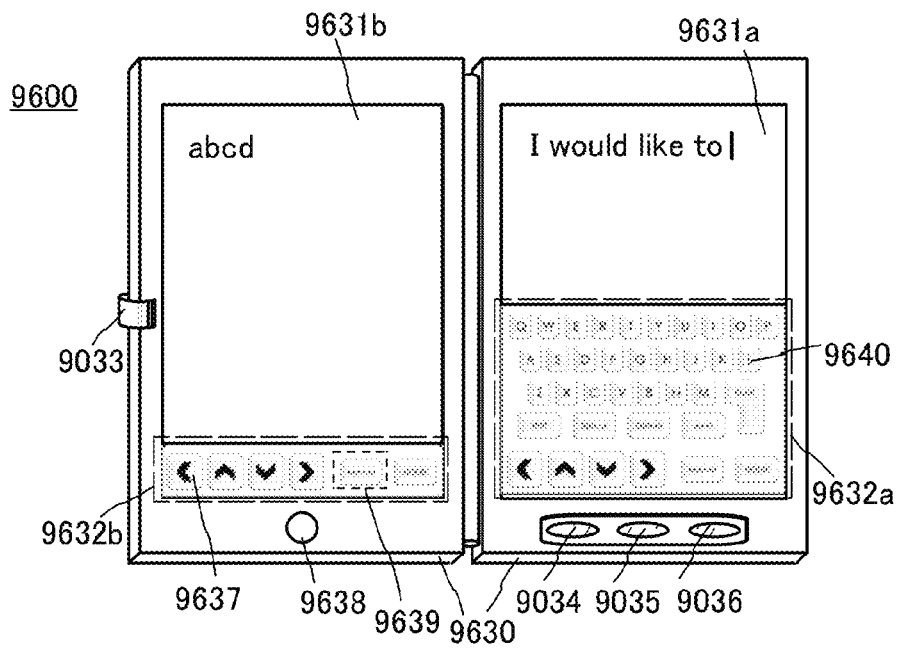
FIGS. 8A to 8C illustrate an electronic device.
Figure 8B:
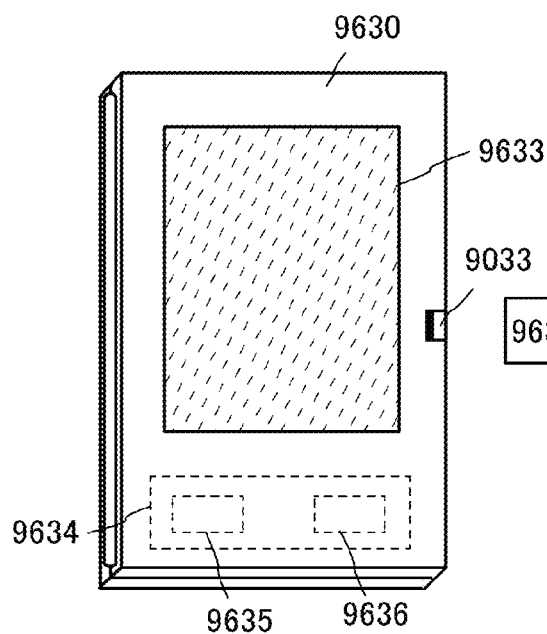
Figure 8C:
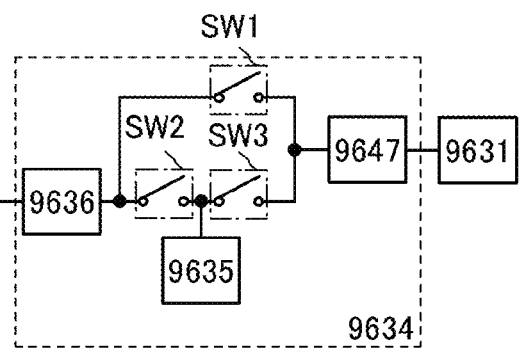

FIGS. 8A to 8C illustrate a specific example of an electronic device 9600. FIGS. 8A and 8B illustrate a foldable tablet terminal. The tablet terminal includes a CPU and the like to which power supply voltage is supplied from a battery.

FIG. 8A illustrates an opened state, and FIG. 8B illustrates a closed state.

As illustrated in FIG. 8A, the tablet terminal includes a housing 9630, a display portion 9631a, a display portion 9631b, a display mode switch 9034, a power switch 9035, a power saver switch 9036, a clasp 9033, and an operation switch 9638.

Part or the whole of the display portion 9631a can be a touch panel region 9632a. Multi-touch input is possible in the touch panel region 9632a. When a user touches a plurality of operation keys 9640 displayed on the display portion 9631a at a time with fingers or the like to input data, a plurality of touch positions can be sensed precisely.

Figure 9A:
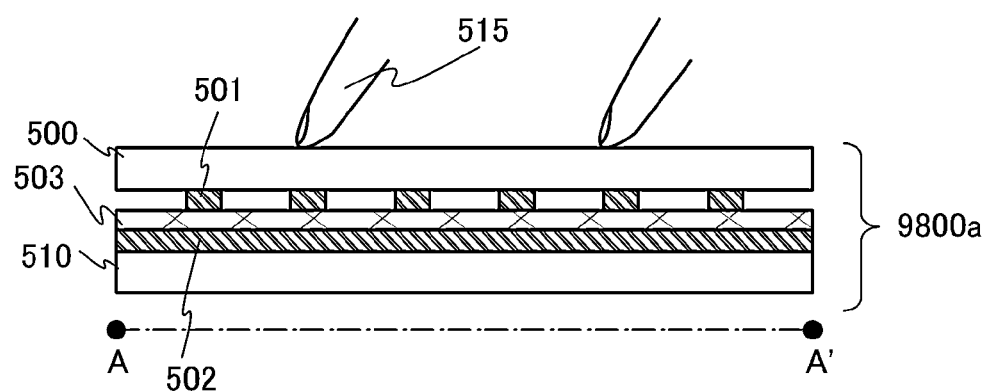
FIGS. 9A to 9C illustrate a touch panel.

A touch panel 9800a illustrated in FIG. 9A is provided in the display portion 9631a.

In the display portion 9631b, part or the whole of the display portion 9631b can be a touch panel region 9632b, in a manner similar to that of the display portion 9631a. By touching a keyboard display switching button 9639 displayed on the display portion 9631b with a finger, a stylus pen, or the like, keyboard buttons can appear on the display portion 9631b. Multi-touch input is possible in the touch panel region 9632b. When a user touches a plurality of operation keys 9637 displayed on the display portion 9631b at a time with fingers, stylus pens, or the like, a plurality of touch positions can be sensed precisely.

Figure 10A:
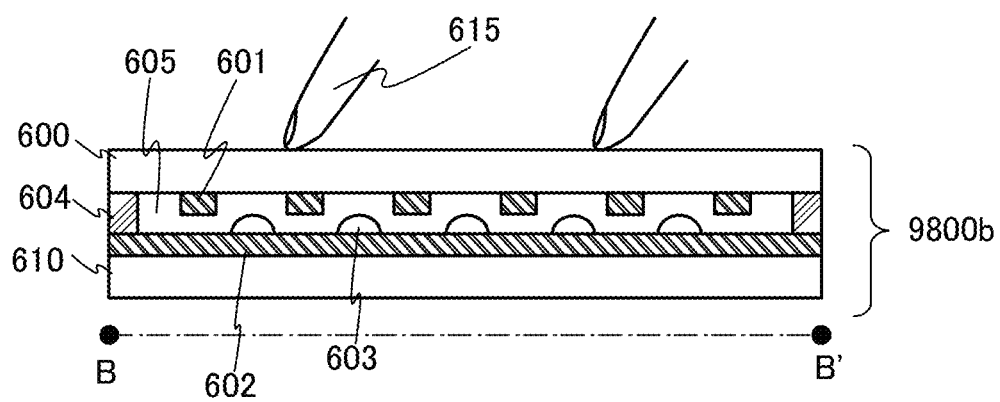
FIGS. 10A to 10C illustrate a touch panel

A touch panel 9800b illustrated in FIG. 10A is provided in the display portion 9631b.

Touch input can be performed in the touch panel region 9632a and the touch panel region 9632b at a time.

Note that FIG. 8A shows, as an example, that half of the area of the display portion 9631a has only a display function, and the other half of the area has a touch panel function; however, the present invention is not limited to this structure. Keyboard buttons can be displayed on the entire screen of the display portion 9631a so that the entire screen of the display portion 9631a is used as a touch panel region, whereas the display portion 9631b can be used as a display screen.

The display mode switch 9034 can switch the display between a portrait mode, a landscape mode, and the like, and between monochrome display and color display, for example. The power saver switch 9036 can optimize display luminance in accordance with the amount of external light detected by an optical sensor incorporated in the tablet terminal when the tablet terminal is in use. In addition to the optical sensor, another detection device including a sensor for detecting inclination, such as a gyroscope sensor or an acceleration sensor, may be incorporated in the tablet terminal. Note that in the power-saving mode, supply of power supply voltage to the CPU included in the tablet terminal may be completely stopped.

Although the display portion 9631a and the display portion 9631b have the same display area in FIG. 8A, one embodiment of the present invention is not limited to this example. They may differ in size and/or image quality. For example, higher definition images may be displayed on one of the display portions 9631a and 9631b.

Figure 9B:
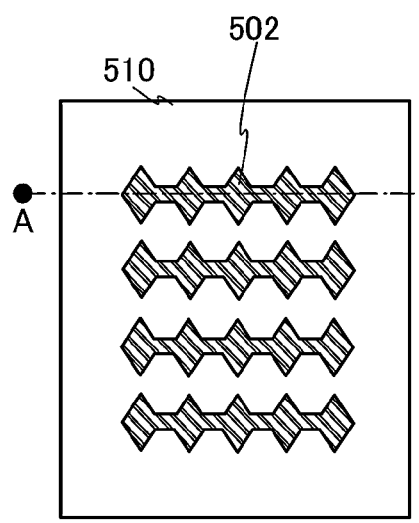
Figure 9C:
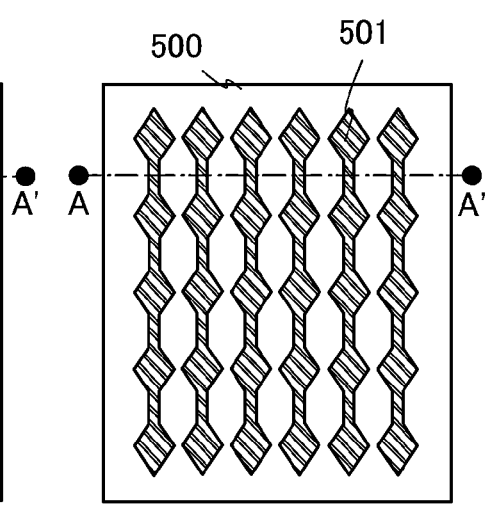

FIG. 9A is a cross-sectional view of the touch panel 9800a. FIGS. 9B and 9C illustrate the placement of conductive oxide films. In FIG. 9A, an example of using a projected capacitive (mutual capacitive) touch panel as the touch panel 9800a is illustrated. A chain line A-A' in FIG. 9A corresponds to those in FIGS. 9B and 9C. By employing any of the conductive oxide films having a crystal structure in which c-axes are aligned in a direction perpendicular to a surface of the film, described in Embodiments 1 and 2, in the touch panel 9800a, the sensing accuracy of the touch panel 9800a can be increased.

As illustrated in FIG. 9A, the touch panel 9800a includes a first substrate 500, a second substrate 510, first conductive oxide films 501, second conductive oxide films 502, and an insulating layer 503.

As materials of the first conductive oxide films 501 and the second conductive oxide films 502, an indium zinc oxide is particularly preferably used.

Note that the first conductive oxide films 501 and the second conductive oxide films 502 each having a crystal structure in which c-axes are aligned in a direction perpendicular to a surface of the film have high conductivity and high transmittance of visible light.

As illustrated in FIG. 9C, the plurality of first conductive oxide films 501 each having a shape of rhombuses linking together in the longitudinal direction are formed over the first substrate 500. As illustrated in FIG. 9B, the plurality of second conductive oxide films 502 each having a shape of rhombuses linking together in the lateral direction are formed over the second substrate 510. Alternatively, the plurality of first conductive oxide films 501 may also be arranged in the lateral direction, and the plurality of second conductive oxide films 502 may also be arranged in the longitudinal direction.

Alternatively, the plurality of first conductive oxide films 501 may be arranged in an oblique direction, and the plurality of second conductive oxide films 502 may be arranged in an oblique direction that is different from the oblique direction of the first conductive oxide films 501. In any case, the first conductive oxide films 501 and the second conductive oxide films 502 are arranged so as to produce overlapping portions of the first conductive oxide films 501 and the second conductive oxide films 502.

The shapes of the first conductive oxide films 501 and the second conductive oxide films 502 are not limited to the shapes illustrated in FIGS. 9A to 9C. The shape may be the shape of a stripe, a quadrangle, the shape of hexagons linking together, or the shape of alternately connecting a triangle and a rhombus.

A method for sensing the touch position in the touch panel 9800a is described. In the overlapping portions of the first conductive oxide films 501 and the second conductive oxide films 502, mutual capacitance is generated between the first conductive oxide films 501 and the second conductive oxide films 502. In the mutual capacitive touch panel 9800a, the mutual capacitance is utilized to sense the touch position. The mutual capacitance is changed by the touch of the touch panel 9800a with the input means 515, and the touch position is sensed by sensing the change.

Note that in a self-capacitance touch panel, the touch position is sensed utilizing self-capacitance (the capacitance generated between the input means 515 and the first conductive oxide film 501, and the capacitance generated between the input means 515 and the second conductive oxide film 502). The self-capacitance is changed by the touch of the touch panel with the input means, and the touch position is sensed by the change. In this embodiment, an example of using a projected-capacitive touch panel of a mutual-capacitive type as the touch panel 9800a is described; however, a projected-capacitive touch panel of a self-capacitive type may be used as any one of the touch panels that do not require a multi-touch sensing function among the touch panels described in this specification. The self-capacitance touch panel can more easily reduce power consumption than the mutual capacitive touch panel.

In the mutual capacitive touch panel 9800a, either the first conductive oxide films 501 or the second conductive oxide films 502 serve as driving electrodes, and the other conductive oxide films serve as reception electrodes. For example, in the case where the first conductive oxide films 501 serve as driving electrodes, driving voltage is sequentially applied to the plurality of electrodes (the first conductive oxide films 501). When the input means 515 touches the touch panel 9800a, the mutual capacitance between the first conductive oxide film 501 and the second conductive oxide film 502 is changed. The change in mutual capacitance changes the potential of the electrode corresponding to the touch position. In the mutual capacitive touch panel 9800a, by sequentially detecting potentials of the plurality of electrodes (the second conductive oxide films 502) serving as reception electrodes, the position where the change in potential (mutual capacitance) occurs is selectively sensed, so that the touch position can be sensed. Since the touch position can be selectively and sequentially sensed in the mutual capacitive touch panel, multi-touch is possible unlike the self-capacitance touch panel. In the self-capacitance touch panel, the way of sensing the potential change (self-capacitance change) using all of a plurality of electrodes (e.g., a plurality of conductive oxide films arranged in the longitudinal direction or a plurality of conductive oxide films arranged in the lateral direction) is conducted. Consequently, when the input means 515 touches a plurality of points on a surface of the first substrate 500 at a time, the touch positions can be sensed precisely.

Figure 10B:
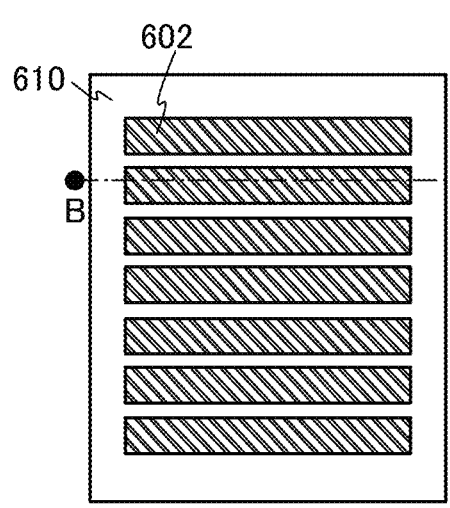
Figure 10C:
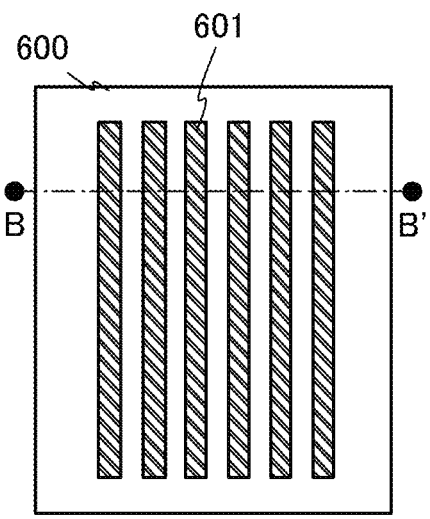

FIG. 10A is a cross-sectional view of the touch panel 9800b. FIGS. 10B and 10C illustrate the placement of conductive oxide films. In FIG. 10A, an example of using a digital resistive touch panel as the touch panel 9800b is illustrated. A chain line B-B' in FIG. 10A corresponds to that in FIGS. 10B and 10C. By employing any of the conductive oxide films having a crystal structure in which c-axes are aligned in a direction perpendicular to a surface of the film, described in Embodiments 1 and 2, in the touch panel 9800b, the sensing accuracy of the touch panel 9800b can be increased. Note that a resistive touch panel has an advantage of easy input with a pen.

As illustrated in FIG. 10A, the touch panel 9800b includes a first substrate 600, a second substrate 610, first conductive oxide films 601, second conductive oxide films 602, a dot spacer 603, a sealant 604, and an air gap 605. Embodiment 3 can be referred to for the detailed description of the structure.

As materials of the first conductive oxide film 601 and the second conductive oxide film 602, an indium zinc oxide is particularly preferably used.

Note that the first conductive oxide films 601 and the second conductive oxide films 602 each having a crystal structure in which c-axes are aligned in a direction perpendicular to a surface of the film have high conductivity and high transmittance of visible light.

As illustrated in FIG. 10C, the plurality of first conductive oxide films 601 each having the shape of a stripe or a quadrangle in the longitudinal direction are formed over the first substrate 600. As illustrated in FIG. 10B, the plurality of second conductive oxide films 602 each having the shape of a stripe or a quadrangle in the lateral direction are formed over the second substrate 610. Alternatively, the plurality of first conductive oxide films 601 may also be arranged in the lateral direction, and the plurality of second conductive oxide films 602 may also be arranged in the longitudinal direction.

The shapes of the first conductive oxide films 601 and the second conductive oxide films 602 are not limited to the shapes illustrated in FIGS. 10A to 10C. The shape may be the shape of hexagons linking together or the shape of alternately connecting a triangle and a rhombus. In the digital resistive touch panel, the first conductive oxide films 601 and the second conductive oxide films 602 are not evenly formed over the substrate surface and are formed so as to be isolated from each other unlike the analog resistive touch panel. Since the electrodes are independently formed, multi-touch is possible.

A method for sensing the touch position in the touch panel 9800b is described. When an input means 615 touches a surface of the first substrate 600 in the state where the air gap 605 and the dot spacer 603 isolate the first conductive oxide films 601 from the second conductive oxide films 602, the first conductive oxide film 601 bends in the direction of the second conductive oxide film 602, and the first conductive oxide film 601 and the second conductive oxide film 602 contact with each other and are brought into conduction. At this time, since the first conductive oxide films 601 and the second conductive oxide films 602 have their own independent electrodes, the potentials of a plurality of touch positions can be detected. Thus, the touch positions can be sensed precisely.

For example, in the case of the touch panel 9800b, driving voltage is applied to a plurality of upper electrodes (the first conductive oxide films 601) to sequentially drive the upper electrodes, and the potential of the touch position is detected from the lower electrode (the second conductive oxide film 602) during the driving period; thus, the touch position can be sensed. Alternatively, the touch position can be sensed in the following manner: driving voltage is applied to a plurality of lower electrodes to sequentially drive the lower electrodes, and the potential of the touch position is detected from the upper electrode during the driving period. Further alternatively, the touch position can be sensed in the following manner: driving voltage is sequentially applied to the plurality of upper electrodes and then driving voltage is sequentially applied to the plurality of lower electrodes (driving voltage is applied alternately to the upper electrodes and the lower electrodes), and the potential of the touch position is detected from the electrode to which driving voltage is not applied. By using an appropriate sensing method, a plurality of touch positions can be sensed precisely. The driving method for sensing the touch position in the digital resistive touch panel 9800b is not particularly limited.

Note that since the first conductive oxide films 601 and the second conductive oxide films 602 have high conductivity and high transmittance of visible light, the sensing accuracy of the touch position in the touch panel 9800b can be increased.

The above-described touch panel 9800 (the touch panel 9800a and the touch panel 9800b) can be externally provided outside a display panel; thus, the electronic device 9600 having the out-cell display panel illustrated in FIG. 8A can be formed.

Alternatively, the touch panel 9800 can be freely incorporated in the display panel in the display portion 9631. The electronic device 9600 including an in-cell display panel having a touch panel function similar to that of the touch panel 9800 may be formed. The electronic device 9600 including an on-cell display panel having a touch panel function similar to that of the touch panel 9800 may be formed.

For example, a touch panel function similar to that of the touch panel 9800 may be incorporated in a pixel of a liquid crystal display device. In this case, the first conductive oxide films and the second conductive oxide films have a function of a touch electrode, and a liquid crystal layer is sandwiched between the first conductive oxide films and the second conductive oxide films. The first conductive oxide films (second conductive oxide films) may be provided separate from a pixel electrode and a common electrode so as to have only a function of a touch electrode. Alternatively, the first conductive oxide films (second conductive oxide films) may be provided separate from a pixel electrode so as to have both a function of a touch electrode and a function of a pixel electrode. Further alternatively, the first conductive oxide films (second conductive oxide films) may be provided separate from a common electrode so as to have both a function of a touch electrode and a function of a pixel electrode.

For example, a touch panel function similar to that of the touch panel 9800 may be incorporated in a pixel of an organic EL display device. In this case, the first conductive oxide films and the second conductive oxide films have a function of a touch electrode, and a light-emitting layer is sandwiched between the first conductive oxide films and the second conductive oxide films. The first conductive oxide films (second conductive oxide films) may be provided separate from a cathode and an anode so as to have only a function of a touch electrode. Alternatively, the first conductive oxide films (second conductive oxide films) may be provided separate from a cathode so as to have both a function of a touch electrode and a function of an anode. Further alternatively, the first conductive oxide films (second conductive oxide films) may be provided separate from an anode so as to have both a function of a touch electrode and a function of a cathode.

For example, in a liquid crystal display device or an organic EL display device, the first conductive oxide films are formed over a surface of a substrate opposite to the surface on which a color filter is formed, and the second conductive oxide films are formed over a surface of a substrate opposite to the surface on which a polarizing plate is formed; thus, a touch panel function similar to that of the touch panel 9800 can be incorporated in the liquid crystal display device or the organic EL display device.

Next, the tablet terminal in the closed state is described.

As illustrated in FIG. 8B, the tablet terminal includes the housing 9630, a solar cell 9633, a charge/discharge control circuit 9634, a battery 9635, and a DC-DC converter 9636. Note that FIG. 8B illustrates an example in which the charge/discharge control circuit 9634 has the battery 9635 and the DCDC converter 9636.

Any of the conductive oxide films having a crystal structure in which c-axes are aligned in a direction perpendicular to a surface of the film, described in Embodiments 1 and 2, can be used in the solar cell 9633. Since the conductive oxide film has high conductivity and high transmittance of visible light, the solar cell 9633 can have high performance.

Since the tablet terminal is foldable, the housing 9630 can be closed when the tablet terminal is not used. As a result, the display portion 9631a and the display portion 9631b can be protected; thus, a tablet terminal having excellent durability and excellent reliability in terms of long-term use can be provided.

The tablet terminal illustrated in FIGS. 8A and 8B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel 9800, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

The structure and the operation of the charge/discharge control circuit 9634 illustrated in FIG. 8B are described with reference to a block diagram in FIG. 8C. The solar cell 9633, the battery 9635, the DCDC converter 9636, a converter 9647, switches SW1 to SW3, and a display portion 9631 are illustrated in FIG. 8C, and the battery 9635, the DCDC converter 9636, the converter 9647, and the switches SW1 to SW3 correspond to the charge/discharge control circuit 9634 illustrated in FIG. 8B.

First, an example of the operation in the case where power is generated by the solar cell 9633 using external light is described. The voltage of power generated by the solar cell is stepped up or down by the DCDC converter 9636 so that the power has voltage for charging the battery 9635. Then, when the power from the solar cell 9633 is used for the operation of the display portion 9631, the switch SW1 is turned on and the voltage of the power is stepped up or down by the converter 9647 so as to be voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, there is no particular limitation on a way of charging the battery 9635, and the battery 9635 may be charged with another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

By using a conductive oxide film having a crystal structure in which c-axes are aligned in a direction perpendicular to a surface of the film and having high conductivity and high transmittance of visible light in a touch panel, a solar cell, or the like, the electronic device can have high performance.

The structures, methods, and the like described in this embodiment can be combined as appropriate with any of the structures, methods, and the like described in the other embodiments.

This application is based on Japanese Patent Application serial no. 2012-195401 filed with Japan Patent Office on Sep. 5, 2012, the entire contents of which are hereby incorporated by reference.

What is claimed is:

1. A conductive oxide film having a crystal structure,
wherein c-axes of the crystal structure are aligned in a direction perpendicular to a surface of the conductive oxide film,
wherein a diffraction peak obtained by X-ray diffraction measurement of the crystal structure is 31°±1°,
wherein the conductive oxide film includes indium and zinc, and
wherein the conductive oxide film has a sheet resistance of lower than or equal to 40 Ω/□.

2. The conductive oxide film according to claim 1, wherein the conductive oxide film has a band gap of larger than or equal to 2.5 eV.

3. A display device comprising a touch panel including the conductive oxide film according to claim 1.

4. The display device according to claim 3, wherein a touch position is sensed by a change in current flowing through the conductive oxide film.

5. A display device comprising:
a first substrate and a second substrate; and
a first conductive oxide film and a second conductive oxide film between the first substrate and the second substrate,
wherein each of the first conductive oxide film and the second conductive oxide film is a conductive oxide film having a crystal structure,
wherein c-axes of the crystal structure are aligned in a direction perpendicular to a surface of the conductive oxide film,
wherein a diffraction peak obtained by X-ray diffraction measurement of the crystal structure is 31°±1°,
wherein the conductive oxide film includes indium and zinc, and
wherein the conductive oxide film has a sheet resistance of lower than or equal to 40 Ω/□.

6. The display device according to claim 5, wherein the conductive oxide film has a band gap of larger than or equal to 2.5 eV.

7. The display device according to claim 5, wherein a touch position is sensed by a contact between the first conductive oxide film and the second conductive oxide film.

8. The display device according to claim 5, wherein a touch position is sensed by a change in capacitance generated between the first conductive oxide film and the second conductive oxide film.

9. The display device according to claim 5, further comprising:
a liquid crystal layer between the first conductive oxide film and the second conductive oxide film.

10. The display device according to claim 5, further comprising:
a light-emitting layer between the first conductive oxide film and the second conductive oxide film.

* * * * *